US011069759B2

(12) United States Patent
Kim et al.

(10) Patent No.: US 11,069,759 B2
(45) Date of Patent: Jul. 20, 2021

(54) ORGANIC LIGHT-EMITTING DISPLAY DEVICE

(71) Applicant: SAMSUNG DISPLAY CO., LTD., Yongin-si (KR)

(72) Inventors: Woongsik Kim, Yongin-si (KR); Jinsu Byun, Yongin-si (KR); Koichi Sugitani, Yongin-si (KR); Gwangmin Cha, Yongin-si (KR); Saehee Han, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 16/547,794

(22) Filed: Aug. 22, 2019

(65) Prior Publication Data
US 2020/0161395 A1 May 21, 2020

(30) Foreign Application Priority Data

Nov. 19, 2018 (KR) .................. 10-2018-0142511

(51) Int. Cl.
H01L 27/32 (2006.01)
H01L 51/52 (2006.01)
(52) U.S. Cl.
CPC ........ H01L 27/3246 (2013.01); H01L 27/323 (2013.01); H01L 51/5253 (2013.01); H01L 51/5262 (2013.01); H01L 51/5275 (2013.01)
(58) Field of Classification Search
CPC ............... H01L 27/323; H01L 27/3246; H01L 27/3225; H01L 27/3244; H01L 27/3295; H01L 51/5275; H01L 51/5262; H01L 51/5253; H01L 51/525; H01L 51/5256; H01L 51/5271; H01L 51/5268
See application file for complete search history.

(56) References Cited

U.S. PATENT DOCUMENTS

| 6,072,450 | A | 6/2000 | Yamada et al. |
| 7,535,646 | B2 | 5/2009 | Chari et al. |
| 8,618,730 | B2* | 12/2013 | Park .................... H01L 51/5275 313/504 |
| 8,823,254 | B2 | 9/2014 | Ohta et al. |

(Continued)

FOREIGN PATENT DOCUMENTS

| JP | 2006-171700 A | 6/2006 |
| JP | 2009-110873 A | 5/2009 |

(Continued)

Primary Examiner — Michael M Trinh
(74) Attorney, Agent, or Firm — Lewis Roca Rothgerber Christie LLP

(57) ABSTRACT

An organic light-emitting display device including a substrate; a pixel in a display area of the organic light-emitting display device, the pixel being implemented by an organic light-emitting diode on the substrate; a first inclination structure surrounding the pixel; a second inclination structure at least partially surrounding the first inclination structure; and a planarization layer covering the first inclination structure and the second inclination structure and having a refractive index that is greater than a refractive index of the first inclination structure and is greater than a refractive index of the second inclination structure, wherein a height of the first inclination structure is greater than a height of the second inclination structure.

21 Claims, 9 Drawing Sheets

(56) References Cited

U.S. PATENT DOCUMENTS

| | | |
|---|---|---|
| 9,142,802 B2 | 9/2015 | Miyamoto et al. |
| 9,257,677 B2 | 2/2016 | Park et al. |
| 9,368,757 B2 | 6/2016 | Choi et al. |
| 9,406,724 B2 | 8/2016 | Choi et al. |
| 9,502,683 B2 * | 11/2016 | Hong ............... H01L 51/524 |
| 9,774,011 B2 | 9/2017 | Choi et al. |
| 9,966,553 B2 * | 5/2018 | Choi ............... H01L 51/5203 |
| 2006/0103779 A1 | 5/2006 | Amemiya et al. |
| 2006/0245060 A1 * | 11/2006 | Goto ............... G02B 5/003 359/613 |
| 2009/0115330 A1 * | 5/2009 | Yamauchi ............ H01L 51/5275 313/506 |
| 2010/0224897 A1 * | 9/2010 | Huang ............... H01L 33/20 257/98 |
| 2012/0104368 A1 | 5/2012 | Isobe et al. |
| 2014/0339509 A1 | 11/2014 | Choi et al. |
| 2015/0333108 A1 | 11/2015 | Miyamoto et al. |
| 2016/0126501 A1 * | 5/2016 | Kim ............... G03F 7/0047 257/40 |
| 2016/0285038 A1 * | 9/2016 | Kim ............... H01L 51/5256 |
| 2018/0012940 A1 | 1/2018 | Park et al. |
| 2018/0047920 A1 * | 2/2018 | Jang ............... H01L 51/56 |
| 2018/0159078 A1 * | 6/2018 | Kook ............... H01L 27/3244 |
| 2018/0254303 A1 | 9/2018 | Mishima |
| 2019/0115404 A1 * | 4/2019 | Moon ............... H01L 51/5271 |
| 2019/0198782 A1 | 6/2019 | Kim et al. |
| 2019/0221778 A1 | 7/2019 | Kim et al. |

FOREIGN PATENT DOCUMENTS

| | | |
|---|---|---|
| JP | 2012-109214 A | 6/2012 |
| KR | 10-2013-0008660 A | 1/2013 |
| KR | 10-2014-0135568 A | 11/2014 |
| KR | 10-2014-0143916 A | 12/2014 |
| KR | 10-2015-0017969 A | 2/2015 |
| KR | 10-2015-0081106 A | 7/2015 |
| KR | 10-2016-0017397 A | 2/2016 |
| KR | 10-2016-0027608 A | 3/2016 |
| KR | 10-2018-0005323 A | 1/2018 |
| KR | 10-2019-0078723 A | 7/2019 |
| KR | 10-2019-0087689 A | 7/2019 |

* cited by examiner

ORGANIC LIGHT-EMITTING DISPLAY DEVICE

CROSS-REFERENCE TO RELATED APPLICATION

Korean Patent Application No. 10-2018-0142511, filed on Nov. 19, 2018, in the Korean Intellectual Property Office, and entitled: "Organic Light-Emitting Display Device," is incorporated by reference herein in its entirety.

BACKGROUND

1. Field

Embodiments relate to an organic light-emitting display device.

2. Description of the Related Art

An organic light-emitting display device may include an organic light-emitting diode including a hole injection electrode, an electron injection electrode, and an organic emission layer therebetween. The organic light-emitting display device is a self-luminous display device that emits light while an exciton falls from an excited state to a ground state, the exciton being generated when a hole injected from the hole injection electrode and an electron injected from the electron injection electrode combine in the organic emission layer.

Since the organic light-emitting display device, which is a self-luminous display device, does not require a separate light source, the organic light-emitting display device may be driven at a low voltage and may be configured in a lightweight slim profile and has high-quality characteristics such as wide viewing angles, high contrast, and fast response speeds.

The organic light-emitting display device includes a plurality of pixels respectively emitting light of different colors, and the plurality of pixels emit light and thus display an image.

Here, a pixel refers to a minimum unit configured to display an image. A gate line and a data line each configured to drive a pixel, a power line such as a driving power line, an insulating layer of a pixel-defining layer configured to define an emission area or a shape of each pixel, etc. may be located between neighboring pixels.

SUMMARY

The embodiments may be realized by providing an organic light-emitting display device including a substrate; a pixel in a display area of the organic light-emitting display device, the pixel being implemented by an organic light-emitting diode on the substrate; a first inclination structure surrounding the pixel; a second inclination structure at least partially surrounding the first inclination structure; and a planarization layer covering the first inclination structure and the second inclination structure and having a refractive index that is greater than a refractive index of the first inclination structure and is greater than a refractive index of the second inclination structure, wherein a height of the first inclination structure is greater than a height of the second inclination structure.

A width of a wall of the first inclination structure may be greater than a width of a wall of the second inclination structure.

The height of the first inclination structure may be 1.2 times or greater of the height of the second inclination structure.

The height of the first inclination structure may be 2.5 μm or greater.

A horizontal separation distance along a top surface of the substrate between an edge of the pixel and an inner edge of the first inclination structure may be about 0.5 μm to about 1.5 μm.

The organic light-emitting display device may further include a third inclination structure at least partially surrounding the second inclination structure, wherein the height of the second inclination structure is substantially the same as a height of the third inclination structure.

The organic light-emitting display device may further include a third inclination structure at least partially surrounding the second inclination structure, wherein the height of the second inclination structure is greater than a height of the third inclination structure.

The first inclination structure may have a closed loop shape, and the second inclination structure may have a closed loop shape.

A cross-sectional shape of the first inclination structure may have a tapered inclination, and an angle θ of the inclination may satisfy the following equation:

$$\theta > \sin^{-1}\left(\frac{n_1}{n_2}\right),$$

in which $n_1$ is a refractive index of the first inclination structure and $n_2$ is a refractive index of the planarization layer.

The organic light-emitting display device may further include a thin-film encapsulation layer covering the organic light-emitting diodes on the substrate, the thin-film encapsulation layer including a first inorganic encapsulation layer, an organic encapsulation layer, and a second inorganic encapsulation layer, wherein the first inclination structure and the second inclination structure are on the thin-film encapsulation layer.

The organic light-emitting display device may further include a dam in a peripheral area of the organic light-emitting display device that is around the display area, wherein the first inorganic encapsulation layer and the second inorganic encapsulation layer directly contact each other outside the dam.

The organic light-emitting display device may further include a thin-film encapsulation layer covering the organic light-emitting diodes on the substrate, the thin-film encapsulation layer including a first inorganic encapsulation layer, an organic encapsulation layer, and a second inorganic encapsulation layer; and a touchscreen layer on the thin-film encapsulation layer, wherein the first inclination structure and the second inclination structure are on the touchscreen layer.

The embodiments may be realized by providing an organic light-emitting display device including a substrate; an organic light-emitting diode in a display area of the organic light-emitting display device, the organic light-emitting diode including a pixel electrode, an intermediate layer, and an opposite electrode; a pixel-defining layer covering edges of the pixel electrode and defining an emission area through an opening that exposes a central portion of the pixel electrode; a thin-film encapsulation layer covering the organic light-emitting diode and including at least one organic encapsulation layer and at least one inorganic encapsulation layer; a plurality of inclination structures on the thin-film encapsulation layer and at least partially surrounding the opening; and a planarization layer covering the plurality of inclination structures, wherein a height of a first inclination structure that is closest to the emission area among the plurality of inclination structures is greater than heights of other inclination structures of the plurality of inclination structures.

The plurality of inclination structures may include a second inclination structure surrounding the first inclination structure, and the height of the first inclination structure may be 1.2 times or greater of a height of the second inclination structure.

A refractive index of each of the plurality of inclination structures may be about 1.4 to about 1.55, and a refractive index of the planarization layer may be about 1.6 to about 1.85.

A horizontal separation distance along a top surface of the substrate between an edge of the opening and an inner edge of the first inclination structure may be about 0.5 µm to about 1.5 µm.

Each of the plurality of inclination structures may have a closed loop shape.

A cross-sectional shape of the first inclination structure may have a tapered inclination, and an angle θ of the inclination may satisfy the following equation:

$$\theta > \sin^{-1}\left(\frac{n_1}{n_2}\right),$$

in which $n_1$ is a refractive index of the first inclination structure and $n_2$ is a refractive index of the planarization layer.

The organic light-emitting display device may further include a dam in a peripheral area around the display area, wherein the at least one inorganic encapsulation layer includes a first inorganic encapsulation layer and a second inorganic encapsulation layer, and the first inorganic encapsulation layer and the second inorganic encapsulation layer directly contact each other outside the dam.

The organic light-emitting display device may further include a touchscreen layer on the thin-film encapsulation layer, wherein the plurality of inclination structures are on the touchscreen layer.

The plurality of inclination structures may include a second inclination structure at least partially surrounding the first inclination structure, the first inclination structure may have a closed loop shape, and the second inclination structure may have a discontinuous shape including a plurality of second sub-islands spaced apart from each other.

BRIEF DESCRIPTION OF THE DRAWINGS

Features will be apparent to those of skill in the art by describing in detail exemplary embodiments with reference to the attached drawings in which.

DETAILED DESCRIPTION

Figure 1:
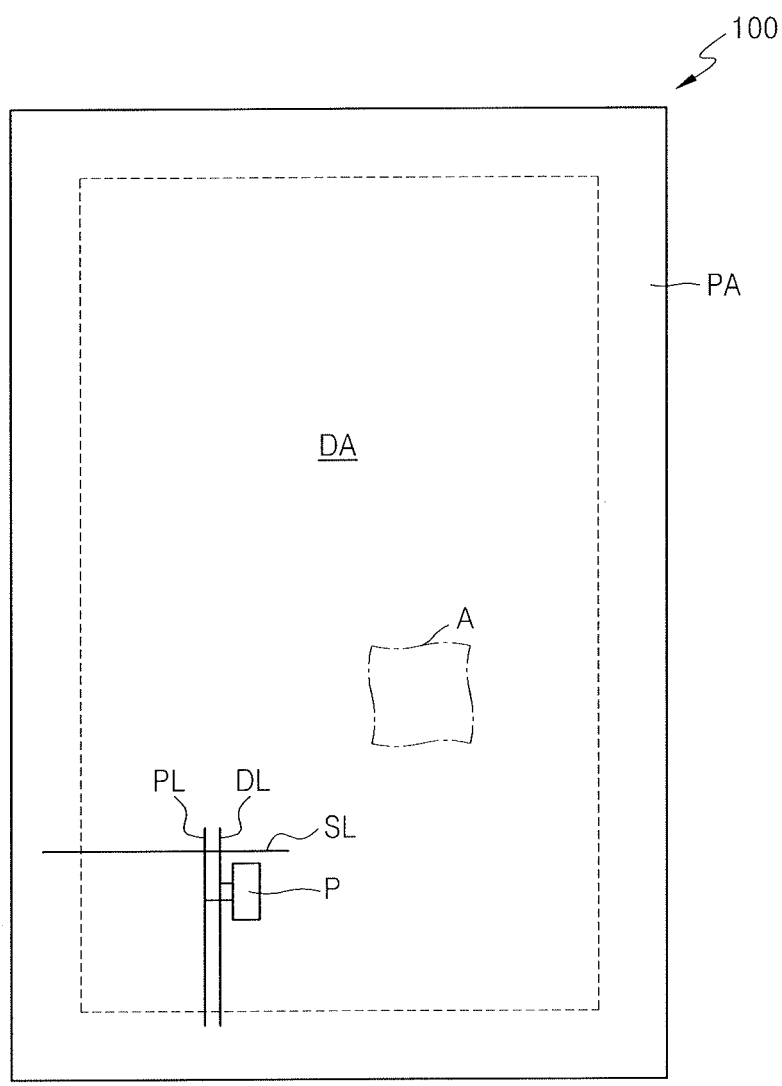
FIG. 1 illustrates a plan view of an organic light-emitting display device according to an embodiment.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

In the drawing figures, the dimensions of layers and regions may be exaggerated for clarity of illustration. It will also be understood that when a layer or element is referred to as being "on" another layer or element, it can be directly on the other layer or element, or intervening layers may also be present. Further, it will be understood that when an element is referred to as being "under" another element, it can be directly under, and one or more intervening elements may also be present. In addition, it will also be understood that when an element is referred to as being "between" two elements, it can be the only element between the two elements, or one or more intervening elements may also be present. Like reference numerals refer to like elements throughout.

As used herein, the terms "or" and "and/or" includes any and all combinations of one or more of the associated listed items. Expressions such as "at least one of" when preceding a list of elements, modify the entire list of elements and do not modify the individual elements of the list.

It will be understood that although the terms "first", "second", etc. may be used herein to describe various components, these components should not be limited by these terms. These components are only used to distinguish one component from another.

As used herein, the singular forms "a", "an" and "the" are intended to include the plural forms as well, unless the context clearly indicates otherwise.

It will be further understood that the terms "comprises/includes" and/or "comprising/including" used herein specify the presence of stated features or components, but do not preclude the presence or addition of one or more other features or components.

It will be understood that when a layer, region, or component is referred to as being "connected" to another layer, region, or component, it may be "directly connected" to the other layer, region, or component or may be "indirectly connected" to the other layer, region, or component with other layer, region, or component interposed therebetween. For example, it will be understood that when a layer, region, or component is referred to as being "connected to or electrically connected" to another layer, region, or component, it may be "directly electrically connected" to the other layer, region, or component or may be "indirectly connected or electrically connected" to other layer, region, or component with other layer, region, or component interposed therebetween.

FIG. 1 illustrates a plan view of an organic light-emitting display device according to an embodiment.

Referring to FIG. 1, a substrate 100 of the organic light-emitting display device may be divided into a display area DA and a peripheral area PA around the display area DA. For example, the organic light-emitting display device may include the substrate 100, and may have a display area DA and a peripheral area PA. The organic light-emitting display device may provide a predetermined image by using light emitted from a plurality of pixels P arranged in the display area DA thereof.

Each pixel P may include an organic light-emitting diode and emit, e.g., red, green, blue, or white light. For example, each pixel P may be connected to a pixel circuit including a thin film transistor TFT and a capacitor. The pixel circuit may be connected to a scan line SL, a data line DL intersecting with the scan line SL, and a driving voltage line PL.

When the pixel circuit is driven, each pixel P may emit light, and the display area DA may provide a predetermined image by using light emitted from the pixels P. In the present specification, the pixel P may be defined as an emission area configured to emit red, green, blue, or white light as described above.

The peripheral area PA is an area in which the pixels P are not arranged and thus may not provide an image. A built-in driving circuit unit configured to drive the pixels P, a power supply line, and a terminal unit to which a printed circuit board including a driving circuit unit, or a driver integrated circuit (IC) is connected may be arranged in the peripheral area PA of the device.

Figure 2A:
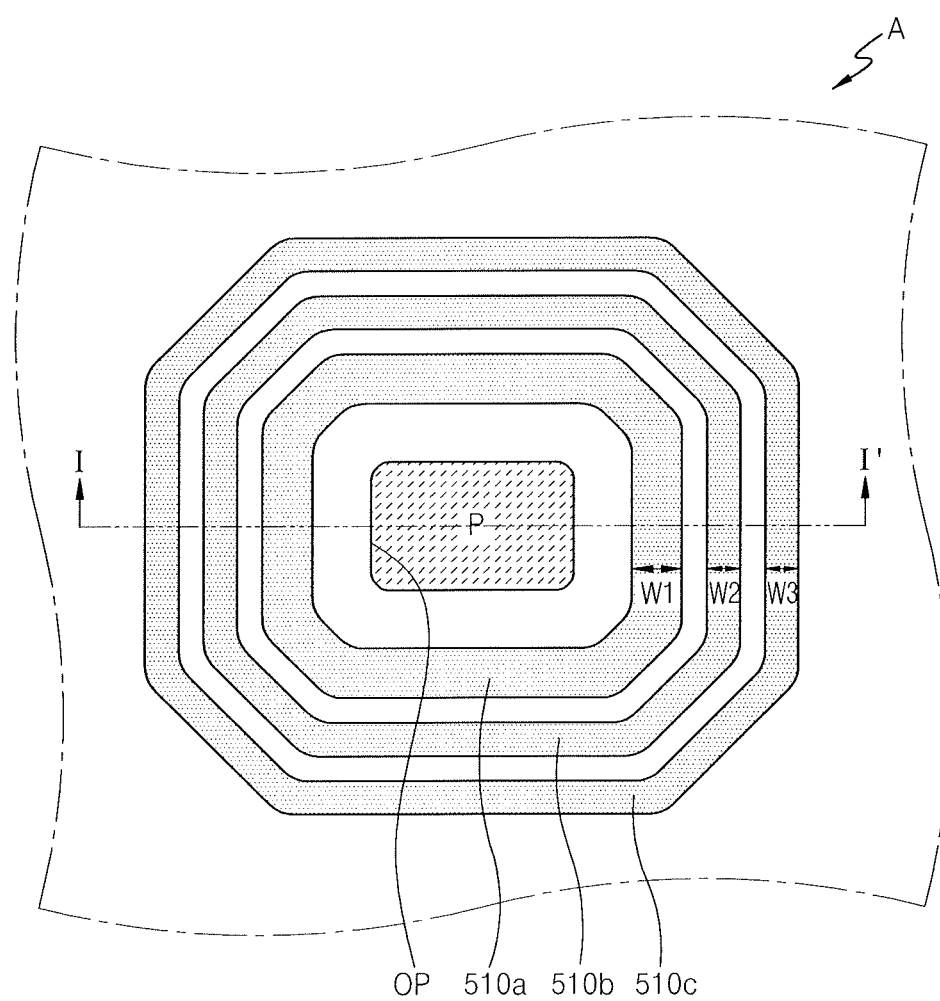
FIGS. 2A and 2B illustrate enlarged plan views of embodiments that may be included in a region A of FIG. 1.
Figure 2B:
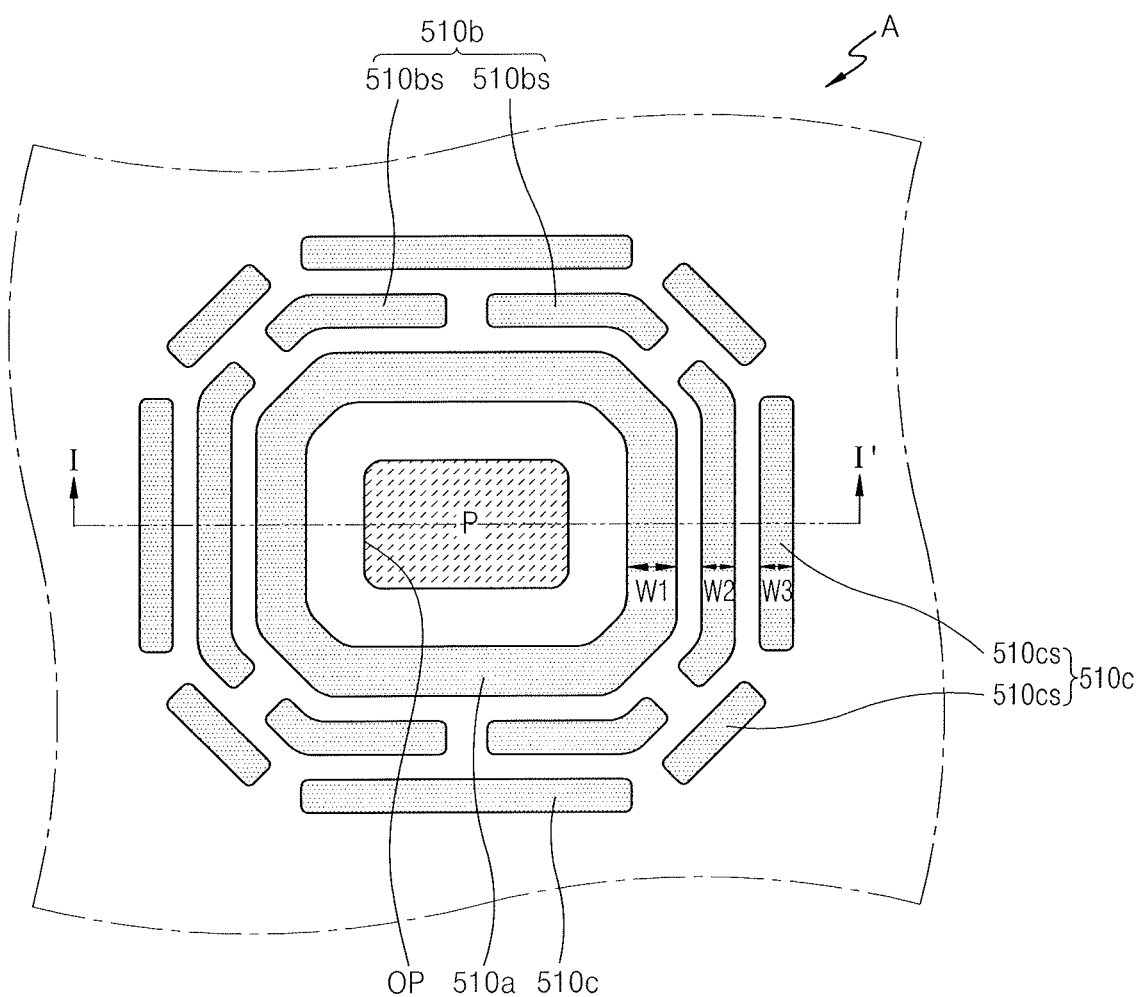

FIGS. 2A and 2B illustrate enlarged plan views of some configuration of embodiments that may be included in a region A of FIG. 1 and show an arrangement relation of a pixel and an inclination structure surrounding the pixel.

Referring to FIGS. 2A and 2B, the organic light-emitting display device includes at least one pixel P and may include a plurality of inclination structures 510a, 510b, and 510c at least partially surrounding the one pixel P, e.g., an emission area of the pixel P. In an implementation, as illustrated in FIG. 2A, the plurality of inclination structures 510a, 510b, and 510c may include three inclination structures. In an implementation, the plurality of inclination structures may be two or more inclination structures. In an implementation, the number of inclination structures may be variously modified.

The plurality of inclination structures 510a, 510b, and 510c may include a first inclination structure 510a, second inclination structure 510b, and third inclination structure 510c. In an implementation, the first inclination structure 510a may have a closed shape (e.g., a continuous or closed loop shape) that is spaced apart from the pixel P, e.g., the emission area of the pixel P and surrounds the pixel P. In an implementation, the second inclination structure 510b may have a closed loop shape that is spaced apart from the first inclination structure 510a and surrounds (e.g., an outer side of) the first inclination structure 510a. In an implementation, the third inclination structure 510c may have a closed loop shape that is spaced apart from the second inclination structure 510b and surrounds (e.g., an outer side of) t the second inclination structure 510b. In an implementation, the first to third inclination structures 510a, 510b, and 510c may have, e.g., a rounded quadrangular ring or octagonal shape.

In an implementation, at least one of the first to third inclination structures 510a, 510b, and 510c may have, instead of a closed loop shape, an open shape in which at least a portion thereof is disconnected.

FIG. 2B illustrates some embodiments of the first to third inclination structures 510a, 510b, and 510c, some of which having an open shape.

Referring to FIG. 2B, the first inclination structure 510a may surround the pixel P in a closed loop shape, and the second and third inclination structures 510b and 510c may have a shape in which a portion thereof is disconnected (e.g., a discontinuous, dashed line, or open shape).

In FIG. 2B, the second inclination structure 510b may be a set of a plurality of second sub-islands 510bs spaced apart from each other and surrounding the first inclination structure 510a. The third inclination structure 510c may be a set of a plurality of third sub-islands 510cs spaced apart from each other and surrounding the second inclination structure 510b.

The number, a shape, a separation distance, a separation location, etc. of second sub-islands 510bs and the third sub-islands 510cs may be variously modified.

The first to third inclination structures 510a, 510b, and 510c may be configured to reflect light emitted from the pixel P and may help improve a front light efficiency and lateral visibility.

In an implementation, a width W1 of (e.g., a wall of) the first inclination structure 510a (e.g., in a radial direction extending outwardly from the pixel P) may be greater than a width W2 of (e.g., a wall of) the second inclination structure 510b and a width W3 of (e.g., a wall of) the third inclination structure 510c. A detailed description of the first to third inclination structures 510a, 510b, and 510c is provided below.

In an implementation, as shown in FIGS. 2A and 2B, three inclination structures, that is, the first to third inclination structures 510a, 510b, and 510c, may surround the pixel P. In an implementation, two or more inclination structures surrounding one pixel P may be provided. The number of inclination structures may be variously modified.

In an implementation, the pixel P may have a shape such as a circle, an ellipse, or a polygon. For example, the pixel P may have a quadrangular shape. In an implementation, a polygon or a quadrangle includes a rounded shape (e.g., with rounded vertices or corners). For example, the pixel P may have a rounded corner quadrangular shape. In an implementation, the pixel P may be provided as a plurality of pixels, and each pixel P may be surrounded by a plurality of inclination structures, e.g., the first to third inclination structures 510a, 510b, and 510c.

In an implementation, the plurality of pixels P may include a first pixel P1 and a second pixel P2, and the number of inclination structures, e.g., the first to third inclination structures 510a, 510b, and 510c, surrounding the first pixel P1 and the number of inclination structures, e.g., the first to third inclination structures 510a, 510b, and 510c, surrounding the second pixel P2 may be different from each other.

The plurality of pixels P may be arranged in various arrangements such as a pentile structure and a stripe structure.

Hereinafter, an organic light-emitting display device according to an embodiment is specifically described according to a stacking sequence shown in FIG. 3.

Figure 3:
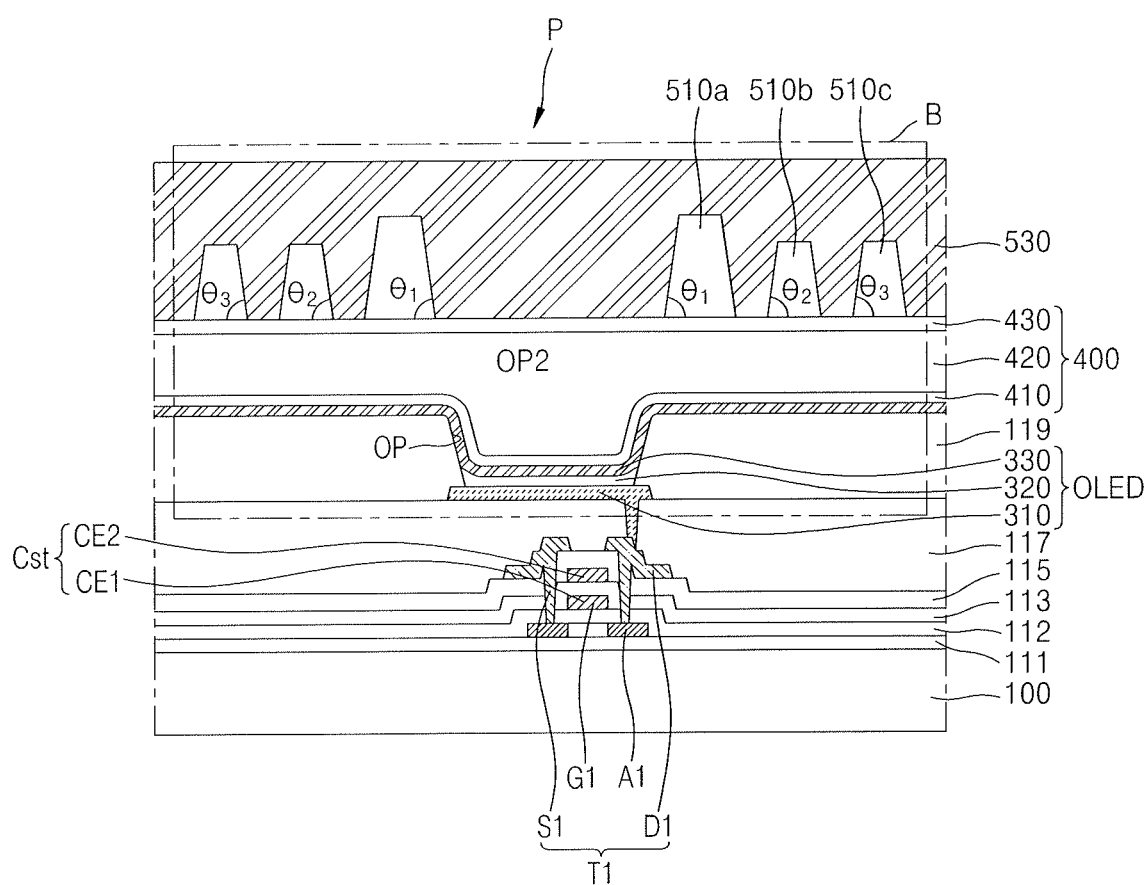
FIG. 3 illustrates a cross-sectional view taken along line I-I' of FIGS. 2A and 2B.
Figure 4:
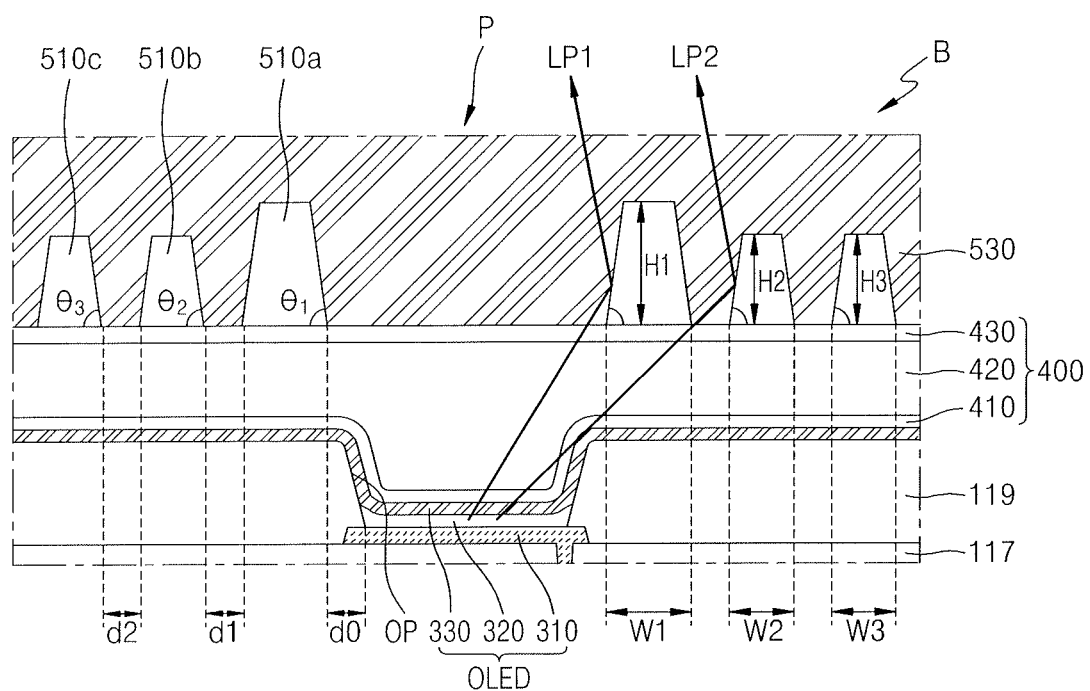
FIG. 4 illustrates an enlarged cross-sectional view of a region B of FIG. 3.

FIG. 3 illustrates a cross-sectional view taken along line I-I' of FIGS. 2A and 2B. FIG. 4 illustrates an enlarged cross-sectional view of a region B of FIG. 3.

Referring to FIG. 3, an organic light-emitting display device according to the present embodiment may include a pixel P implemented as an organic light-emitting diode OLED. The organic light-emitting display device may include a thin-film encapsulation layer 400 covering the organic light-emitting diode OLED, the first to third inclination structures 510a, 510b, and 510c on the thin-film encapsulation layer 400, and a planarization layer 530 covering the plurality of inclination structures 510a, 510b, and 510c and having a refractive index that is greater than those of the plurality of inclination structures 510a, 510b, and 510c.

The plurality of inclination structures 510a, 510b, and 510c may surround the emission area of one pixel P. The plurality of inclination structures 510a, 510b, and 510c may include the first inclination structure 510a, the second inclination structure 510b, and the third inclination structure 510c.

In the present embodiment, a height H1 of the first inclination structure 510a that is most adjacent to (e.g., closest to or proximate to) the pixel P among the plurality of inclination structures 510a, 510b, and 510c surrounding one pixel P may be greater than those of the other inclination structures, e.g., the second and third inclination structures 510b and 510c (e.g., distal to the pixel P). For example, heights of the inclination structures may be measured relative to a surface of the thin-film encapsulation layer 400 in a direction orthogonal to the surface of the thin-film encapsulation layer 400.

In an implementation, as illustrated, one thin film transistor T1 and a storage capacitor Cst of a pixel circuit configured to drive the organic light-emitting diode OLED may be provided. In an implementation, the number of thin film transistors may be two to seven and may be variously modified.

The substrate 100 may include a glass material, a ceramic material, a metal material, or a flexible or bendable material. In the case where the substrate 100 is flexible or bendable, the substrate 100 may include a polymer resin such as polyethersulfone (PES), polyacrylate (PAR), polyetherimide (PEI), polyethylene naphthalate (PEN), polyethylene terephthalate (PET), polyphenylene sulfide (PPS), polyarylate, polyimide (PI), polycarbonate (PC), or cellulose acetate propionate (CAP). The substrate 100 may have a single layered or multi-layered structure including the above materials. In the case where the substrate 100 has a multi-layered structure, the substrate 100 may further include an inorganic layer. In an embodiment, the substrate 100 may have a structure of an organic material/inorganic material/organic material.

A buffer layer 111 may be on the substrate 100, may help reduce or block penetration of foreign substances, moisture, or external air from below the substrate 100, and provide a flat surface on the substrate 100. The buffer layer 111 may include an inorganic material such as an oxide or a nitride, or an organic material, or an organic/inorganic composite material and have a single layered or multi-layered structure including an inorganic material and an organic material.

A barrier layer may be further arranged between the substrate 100 and the buffer layer 111. The barrier layer may help prevent or minimize penetration of impurities from the substrate 100 into a semiconductor layer A1. The barrier layer may include an inorganic material such as an oxide or a nitride, or an organic material, or an organic/inorganic composite material and have a single layered or multi-layered structure including an inorganic material and an organic material.

The semiconductor layer A1 may be arranged on the buffer layer 111. The semiconductor layer A1 may include amorphous silicon or polycrystalline silicon. In an implementation, the semiconductor layer A1 may include an oxide of at least one of In, Ga, Sn, Zr, V, Hf, Cd, Ge, Cr, Ti, Al, Cs, Ce, and Zn. In an implementation, the semiconductor layer A1 may include, as a Zn oxide-based material, Zn oxide, In—Zn oxide, and Ga—In—Zn oxide. In an implementation, the semiconductor layers A1 may include a semiconductor including IGZO (In—Ga—Zn—O), ITZO (In—Sn—Zn—O), or IGTZO (In—Ga—Sn—Zn—O) in which ZnO contains metal such as In, Ga, or Sn. The semiconductor layer A1 may include a channel region, and a source region and a drain region respectively arranged on two opposite sides of the channel region. The semiconductor layer A1 may include a single layer or a multi-layer.

A gate electrode G1 may be on the semiconductor layer A1 with a first gate insulating layer 112 therebetween such that the gate electrode G1 overlaps at least a portion of the semiconductor layer A1. The gate electrode G1 may include at least one of Mo, Al, Cu, and Ti, and may include a single layer or a multi-layer. For example, the gate electrode G1 may include a single layer including Mo.

The first gate insulating layer 112 may include $SiO_2$, SiNx, SiON, $Al_2O_3$, $TiO_2$, $Ta_2O_5$, $HfO_2$, or $ZnO_2$.

A second gate insulating layer 113 may be provided to cover the gate electrode G1. The second gate insulating layer 113 may include $SiO_2$, SiNx, SiON, $Al_2O_3$, $TiO_2$, $Ta_2O_5$, $HfO_2$, or $ZnO_2$.

A first electrode CE1 of the storage capacitor Cst may overlap the thin film transistor T1. For example, the gate electrode G1 of the thin film transistor T1 may serve as the first electrode CE1 of the storage capacitor Cst.

A second electrode CE2 of the storage capacitor Cst overlaps the first electrode CE1 with the second gate insulating layer 113 therebetween. In this case, the second gate insulating layer 113 may serve as a dielectric layer of the storage capacitor Cst. The second electrode CE2 may include a conductive material including at least one of Mo, Al, Cu, and Ti, and include a single layer or a multi-layer including the above materials. For example, the second electrode CE2 may include a single layer of Mo or a multi-layer of Mo/Al/Mo.

In an implementation, as shown in the drawing, the storage capacitor Cst may overlap the thin film transistor T1. In an implementation storage capacitor Cst may not overlap the thin film transistor T1 and various modifications may be made.

An interlayer insulating layer 115 may cover the second electrode CE2 of the storage capacitor Cst. The interlayer insulating layer 115 may include $SiO_2$, SiNx, SiON, $Al_2O_3$, $TiO_2$, $Ta_2O_5$, $HfO_2$, or $ZnO_2$.

A source electrode S1 and a drain electrode D1 may be on the interlayer insulating layer 115. The source electrode S1 and the drain electrode D1 may include a conductive material including at least one of Mo, Al, Cu, and Ti, and include a single layer or a multi-layer including the above materials. For example, each of the source electrode S1 and the drain electrode D1 may have a multi-layered structure of Ti/Al/Ti.

A via layer 117 may be on the source electrode S1 and the drain electrode D1, and the organic light-emitting diode OLED may be located on the via layer 117.

The via layer 117 may have a flat top surface such that a pixel electrode 310 is formed flat. The via layer 117 may include a single layer or a multi-layer including an organic material. The via layer 117 may include a general-purpose polymer such as benzocyclobutene (BCB), polyimide, hexamethyldisiloxane (HMDSO), polymethylmethacrylate (PMMA) or polystyrene (PS), or polymer derivatives having a phenol-based group, an acryl-based polymer, an imide-based polymer, an aryl ether-based polymer, an amide-based polymer, a fluorine-based polymer, a p-xylene-based polymer, a vinyl alcohol-based polymer, or a blend thereof. The via layer 117 may include an inorganic material. The via layer 117 may include $SiO_2$, SiNx, SiON, $Al_2O_3$, $TiO_2$, $Ta_2O_5$, $HfO_2$, or $ZnO_2$. In the case where the via layer 117 includes an inorganic material, chemical planarization polishing may be performed depending on a case. Meanwhile, the via layer 117 may include both an organic material and an inorganic material.

The organic light-emitting diode OLED may be on the via layer 117 in the display area DA of the substrate 100. The organic light-emitting diode OLED may include the pixel electrode 310, an intermediate layer 320 including an organic emission layer, and an opposite electrode 330.

The via layer 117 includes a via hole exposing one of the source electrode S1 and the drain electrode D1 of the thin film transistor T1, and the pixel electrode 310 is electrically connected to the thin film transistor T1 by contacting the source electrode S1 or the drain electrode D1 through the via hole.

The pixel electrode 310 may include a (semi) transparent electrode or a reflective electrode. In an embodiment, the pixel electrode 310 may include a reflective layer including Ag, Mg, Al, Pt, Pd, Au, Ni, Nd, Ir, Cr, or a compound thereof, and a transparent or semi-transparent electrode layer on the reflective layer. The transparent or semi-transparent electrode layer may include at least one of indium tin oxide (ITO), zinc oxide (IZO), zinc oxide (ZnO), indium oxide ($In_2O_3$), indium gallium oxide (IGO), and aluminum zinc oxide (AZO). In an implementation, the pixel electrode 310 may have a stacked structure of ITO/Ag/ITO.

A pixel-defining layer 119 may be on the via layer 117. The pixel-defining layer 119 may define emission areas of the pixels P1, P2, and P3 by including openings respectively corresponding to pixel electrodes 310 in the display area DA, that is, openings OP1, OP2, and OP3 that respectively expose at least central portions of the pixel electrodes 310. Also, the pixel-defining layer 119 may prevent an arc, etc. from occurring at an edge of the pixel electrode 310 by increasing a distance between the edge of the pixel electrode 310 and the opposite electrode 330 over the pixel electrode 310. The pixel-defining layer 119 may include an organic insulating material such as polyimide, polyamide, an acrylic resin, BCB, polyimide, HMDSO, and a phenolic resin and may be formed by spin coating, etc.

The pixel P, e.g., the emission area of the pixel P, may be defined by the opening OP of the pixel-defining layer 119. For example, an edge of the pixel P may denote an edge of the opening OP of the pixel-defining layer 119. Also, the edge of the opening OP of the pixel-defining layer 119 may denote a boundary of the pixel electrode 310 that is exposed by the opening OP.

The intermediate layer 320 of the organic light-emitting diode OLED may include an organic emission layer. The organic emission layer may include an organic material including a fluorescent or phosphorescent material which emits red, green, blue, or white light. The organic emission layer may include a low molecular weight or polymer organic material. A functional layer such as a hole transport layer (HTL), a hole injection layer (HIL), an electron transport layer (ETL), and an electron injection layer (EIL) may be selectively further arranged under and on the organic emission layer. In an implementation, the intermediate layer 320 may correspond to each of the plurality of pixel electrodes 310. The intermediate layer 320 may include a layer that is one body (e.g., commonly) over the plurality of pixel electrodes 310. Various modifications may be made.

The opposite electrode 330 may include a light-transmissive electrode or a reflective electrode. In an implementation, the opposite electrode 330 may include a transparent or semi-transparent electrode and may include a metal thin film having a small work function and including Li, Ca, LiF/Ca, LiF/Al, Al, Ag, Mg, and a compound thereof. Also, a transparent conductive oxide (TCO) layer such as ITO, IZO, ZnO, or $In_2O_3$ may be further arranged on the metal thin film. The opposite electrode 330 may be arranged over the display area DA and the peripheral area PA and arranged over the intermediate layer 320 and the pixel-defining layer 119. The opposite electrode 330 may be provided as one body over a plurality of organic light-emitting diodes OLED and may correspond to the plurality of pixel electrodes 310.

In an implementation, in the case where the pixel electrode 310 includes a reflective electrode and the opposite electrode 330 includes a light-transmissive electrode, light emitted from the intermediate layer 320 may be emitted toward the opposite electrode 330 and a display device may be a top-emission display device. In the case where the pixel electrode 310 includes a transparent or semi-transparent electrode and the opposite electrode 330 includes a reflective electrode, light emitted from the intermediate layer 320 may be emitted toward the substrate 100 and a display device may be a bottom-emission display device. A display device according to the present embodiment may be a dual-emission display device which emits light in two directions of a top direction and a bottom direction.

The thin-film encapsulation layer 400 may help prevent penetration of external moisture and oxygen by covering the display area DA and the peripheral area PA. The thin-film encapsulation layer 400 may include at least one organic encapsulation layer and at least one inorganic encapsulation layer. In an implementation, as shown in FIG. 3, the thin-film encapsulation layer 400 may include two inorganic encapsulation layers, e.g., the first and second inorganic encapsulation layers 410 and 430, and one organic encapsulation layer 420. In an implementation, a stacking sequence and the number of times layers may vary.

The first inorganic encapsulation layer 410 may cover the opposite electrode 330 and include silicon oxide, silicon nitride and/or silicon oxynitride. In an implementation, other layers such as a capping layer may be between the first inorganic encapsulation layer 410 and the opposite electrode 330. In an implementation, the first inorganic encapsulation layer 410 may be formed along a structure thereunder, and a top surface thereof may not be flat. The organic encapsulation layer 420 covers the first inorganic encapsulation layer 410. Unlike the first inorganic encapsulation layer 410, a top surface of the organic encapsulation layer 420 may be approximately flat. For example, the top surface of the organic encapsulation layer 420 that corresponds to the display area DA may be approximately flat. The organic encapsulation layer 420 may include at least one of acrylic, methacrylic, polyester, polyethylene, polypropylene, PET, PEN, PC, PI, polyethylene sulfonate, polyoxymethylene, polyarylate, and HMDSO. The second inorganic encapsulation layer 430 may cover the organic encapsulation layer 420 and include silicon oxide, silicon nitride and/or silicon oxynitride.

As described above, the thin-film encapsulation layer 400 may include the first inorganic encapsulation layer 410, the organic encapsulation layer 420, and the second inorganic encapsulation layer 430, and even when a crack occurs inside the thin-film encapsulation layer 400, cracks that have occurred between the first inorganic encapsulation layer 410 and the organic encapsulation layer 420 and between the organic encapsulation layer 420 and the second inorganic encapsulation layer 430 may not be connected to each other through such a multi-layered structure. Through this, forming of a path through which external moisture or oxygen may penetrate into the display area DA may be prevented or minimized.

The inclination structures 510a, 510b, and 510c may be on the thin-film encapsulation layer 400. In an implementation, each of the inclination structures 510a, 510b, and 510c may have a ring or closed loop shape surrounding the pixel P when viewed from above as in FIG. 2A (top view).

In an implementation, at least one of the first inclination structure 510a, the second inclination structure 510b, and the third inclination structure 510c may have an open or discontinuous shape instead of a closed loop shape and thus have a shape in which a portion thereof is disconnected.

In an implementation, as shown in FIG. 3, a cross-section of each of the first to third inclination structures 510a, 510b, and 510c may have a shape in which an inner wall thereof is tapered or inclined. For example, a wall thickness (e.g., width) of each of the first to third inclination structures 510a, 510b, and 510c may be gradually reduced in a direction away from the substrate 100.

In an implementation, the planarization layer 530 may be on the thin-film encapsulation layer 400 to cover the first to third inclination structures 510a, 510b, and 510c. The planarization layer 530 may have a refractive index $n_2$ that is greater than a refractive index $n_1$ of the first to third inclination structures 510a, 510b, and 510c to allow light emitted from the organic light-emitting diode OLED to be reflected or totally reflected by the first to third inclination structures 510a, 510b, and 510c. For example, a relative refractive index of the first to third inclination structures 510a, 510b, and 510c with respect to the planarization layer 530 may be less than 1, and total reflection may occur on inner inclination surfaces of the first to third inclination structures 510a, 510b, and 510c.

The first to third inclination structures 510a, 510b, and 510c may each include a material having a refractive index of about 1.4 to about 1.55. For example, the first to third inclination structures 510a, 510b, and 510c may each include an acrylic organic material having a refractive index of about 1.4 to about 1.55. For example, the first to third inclination structures 510a, 510b, and 510c may each include ethylhexyl acrylate, pentafluoropropyl acrylate, poly (ethylene glycol) dimethacrylate, or ethylene glycol dimethacrylate.

The first to third inclination structures 510a, 510b, and 510c may be formed by coating an organic material having a low refractive index and then performing patterning with a photoresist pattern by a mask process.

The planarization layer 530 may include a material having a refractive index $n_2$ of about 1.6 to about 1.85. For example, the planarization layer 530 may include an organic material having a refractive index $n_2$ of about 1.6 to about 1.85. The planarization layer 530 may include an acrylic organic material or siloxane organic material. For example, the planarization layer 530 may include polydiarylsiloxane, methyltrimethoxysilane, or tetramethoxysilane. In an implementation, the planarization layer 530 may include a dispersion particle for making a high refractive index. For example, the planarization layer 530 may disperse metal oxide particles such as ZnOx, $TiO_2$, $ZrO_2$, and BaTiO3. The planarization layer 530 may be formed by coating an organic material having a high refractive index using ink-jet.

An angle θ formed by an inner tapered inclination (e.g., inner or pixel facing side wall) of the first to third inclination structures 510a, 510b, and 510c and a top surface of the thin-film encapsulation layer 400 may be selected such that total reflection of light emitted from the organic light-emitting diode OLED may occur. In an implementation, the angle θ of the inner side wall of the first to third inclination structures 510a, 510b, and 510c may satisfy the following equation.

$$\theta > \sin^{-1}\left(\frac{n_1}{n_2}\right)$$

In the above equation, $n_1$ is the refractive index of the respective one of the inclination structures, and $n_2$ is the refractive index of the planarization layer)

In an implementation, a first angle θ1 formed by the inner side wall of the first inclination structure 510a and the top surface of the thin-film encapsulation layer 400, a second angle θ2 formed by the inner side wall of the second inclination structure 510b and the top surface of the thin-film encapsulation layer 400, and a third angle θ3 formed by the inner side wall of the third inclination structure 510c and the top surface of the thin-film encapsulation layer 400 may be substantially the same. In an implementation, at least one of the first angle θ1, the second angle θ2, and the third angle θ3 may be different. In an implementation, the first angle θ1, the second angle θ2, and the third angle θ3 may be the same or different from each other within a range satisfying the equation above. In an implementation, the first angle θ1, the second angle θ2, and the third angle θ3 may have a value of 65° or greater.

In an implementation, the organic light-emitting display device may include the plurality of first to third inclination structures 510a, 510b, and 510c with respect to or associated with one pixel, and a path of light emitted to a lateral side (e.g., of the pixel P) may be changed within a wider range of angles and thus light efficiency and lateral visibility may be improved.

In an implementation, a height H1 of the first inclination structure 510a (e.g., most adjacent or proximate to its corresponding pixel P) among the plurality of first to third inclination structures 510a, 510b, and 510c surrounding one pixel P may be the greatest.

Referring to FIG. 4, which illustrates an enlarged view of a region B of FIG. 3, the height H1 of the first inclination structure 510a may be greater than a height H2 of the second inclination structure 510b and/or a height H3 of the third inclination structure 510c. For example, H1>H2=H3.

Lights LP1 and LP2 emitted to lateral sides may be reflected by inner inclination surfaces (e.g., inner side walls) of the plurality of inclination structures 510a, 510b, and 510c and emitted, increasing all of the heights of the plurality of inclination structures 510a, 510b, and 510c so as to increase a front light efficiency may be considered.

However, patterns formed using a photoresist may be formed by a process in the inclination structures 510a, 510b, and 510c, and if all of the heights of the plurality of inclination structures 510a, 510b, and 510c were to be increased, widths W1, W2, and W3 of or between lateral walls of the plurality of inclination structures 510a, 510b, and 510c may also be increased so as to secure a stable process. Accordingly, a space in which the plurality of inclination structures 510a, 510b, and 510c are to be arranged may be insufficient, or a separation distance d1 between the first inclination structure 510a and the second inclination structure 510b, and a separation distance d2 between the second inclination structure 510b and the third inclination structure 510c may not be secured.

In an implementation, the first inclination structure 510a may be most adjacent or closest to the emission area of the pixel P, and the density or intensity of the light LP1, which is reflected by the first inclination structure 510a, may be greater than the density or intensity of the light LP2, which is reflected by the second and third inclination structures 510b and 510c. For example, an amount of the light LP1 reflected by the first inclination structure 510a may be about 70% of an amount of light reflected by all of the plurality of inclination structures 510a, 510b, and 510c.

The present embodiment may help improve light efficiency by providing the first inclination structure 510a in a largest size. In an implementation, the second inclination structure 510b and the third inclination structure 510c may be relatively smaller, and a space in which the second inclination structure 510b and the third inclination structure 510c are arranged may be secured and thus lateral visibility may be improved.

In the present embodiment, the first width W1, which is a width of a lateral wall (e.g., a maximum distance between side walls) of the first inclination structure 510a may be greater than the second width W2, which is a width of a lateral wall of the second inclination structure 510b, and the third width W3, which is a width of a lateral wall of the third inclination structure 510c. For example, W1>W2=W3.

In an implementation, values of W1, W2, and W3 representing the widths of the lateral walls may be defined based on bottom surfaces of the inclination structures 510a, 510b, and 510c (e.g., are the widths of the inclination structures as measured where the structures contact thin-film encapsulation layer 400).

In an implementation, the first width W1, which is the width of the lateral wall of the first inclination structure 510a, may be 2.5 μm or greater. In the case where the first width W1 is about 2.5 μm, the height H1 of the first inclination structure 510a may be about 2.5 μm to about 3.0 μm. For example, W1:H1=1:1~1.2.

In an implementation, the first height H1 and the first width W1 may be about 2.5 μm or more, thin-film encapsulation layer 400, the first height H1 may be 1.2 times or greater relative to the second height H2 (e.g., H1≥1.2*H2). In an implementation, the second height H2 may be 80% or less of the first height H1. In an implementation, the third height H3 may be 70% or less of the first height H1.

In an implementation, the second width W2, which is the width of the lateral wall of the second inclination structure 510b, may be about 1.2 μm to about 2 μm. In this case, the height H2 of the second inclination structure 510b may be about 1.2 μm to about 2.4 μm.

In an implementation, the third width W3, which is the width of the lateral wall of the third inclination structure 510c, may be about 1.2 μm to about 2 μm. In this case, the height H3 of the third inclination structure 510c may be about 1.2 μm to about 2.4 μm.

In an implementation, the pixel P and the first inclination structure 510a may be arranged such that a horizontal (e.g., lateral in plan view) separation distance d0 is between an edge of the pixel P and the first inclination structure 510a or between an edge of the opening OP of the pixel-defining layer 119 and the first inclination structure 510a. In this case, the horizontal separation distance d0 may be selected taking into account a light path that depends on a refractive index of each medium.

In an implementation, the horizontal separation distance d0 may be about 0.5 μm to about 1.5 μm. Here, the horizontal separation distance d0 may denote a separation distance along the top surface of the substrate 100.

In an implementation, a first separation distance d1 between the first inclination structure 510a and the second inclination structure 510b, and a second separation distance d2 between the second inclination structure 510b and the third inclination structure 510c may be about 0.5 μm to about 1 μm. The first separation distance d1 and the second separation distance d2 may be defined based on or at the bottom surfaces of the inclination structures 510a, 510b, and 510c.

Figure 5:
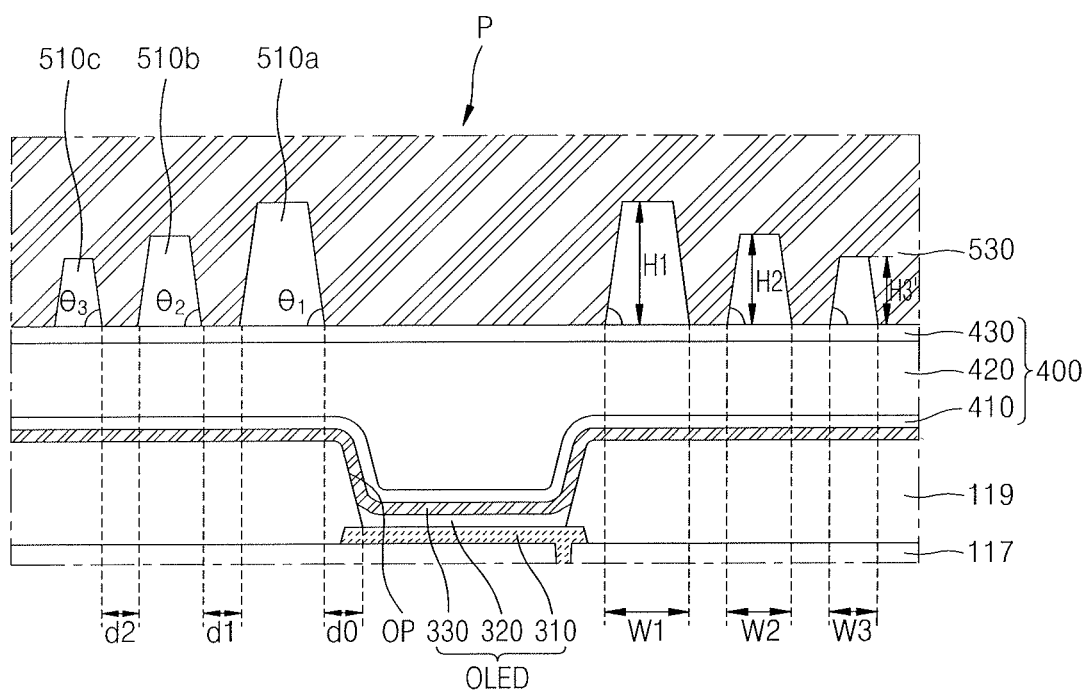
FIG. 5 illustrates a cross-sectional view of a portion of an organic light-emitting display device according to another embodiment.

FIG. 5 illustrates a cross-sectional view of a portion of an organic light-emitting display device according to another embodiment. In FIG. 5, since the same reference numerals as those of FIG. 4 denote the same elements, repeated descriptions thereof are omitted.

Referring to FIG. 5, an organic light-emitting display device according to the present embodiment may include the pixel P implemented as the organic light-emitting diode OLED, the thin-film encapsulation layer 400 covering the organic light-emitting diode OLED, the plurality of inclination structures 510a, 510b, and 510c on the thin-film encapsulation layer 400, and the planarization layer 530 covering the plurality of inclination structures 510a, 510b, and 510c and having a refractive index greater than those of the inclination structures 510a, 510b, and 510c.

The plurality of inclination structures 510a, 510b, and 510c may surround the emission area of one pixel P. The plurality of inclination structures 510a, 510b, and 510c may include the first inclination structures 510a, the second inclination structures 510b, and the third inclination structures 510c.

In an implementation, the heights of the plurality of inclination structures 510a, 510b, and 510c surrounding one pixel may be different from each other. In an implementation, as an inclination structure is adjacent to a pixel P, the inclination structure may have a greater height. In an implementation, as an inclination structure is adjacent to a pixel P, the inclination structure may have a greater width of a lateral wall.

The first inclination structure 510a is most adjacent to the pixel P and may have an inclination of the first angle θ1 on an inner lateral surface thereof. The first height H1, which is the height of the first inclination structure 510a, may be greater than the second height H2, which is the height of the second inclination structure 510b, and the third height H3, which is the height of the third inclination structure 510c. The first width W1, which is the width of the first inclination structure 510a, may be greater than the second width W2, which is the width of the second inclination structure 510b, and the third width W3, which is the width of the third inclination structure 510c.

The second inclination structure 510b is outside of the first inclination structure 510a and may have an inclination of the second angle θ2 on an inner lateral surface thereof. The second height H2, which is the height of the second inclination structure 510b, may be greater than the third height H3, which is the height of the third inclination structure 510c. The second width W2, which is the width of the second inclination structure 510b, may be greater than the third width W3, which is the width of the third inclination structure 510*c*. In an implementation, relations of H1>H2>H3, W1>W2>W3 may be established.

The third inclination structure 510*c* may be arranged outside the second inclination structure 510*b* and may have an inclination of the third angle θ3 at an inner lateral surface thereof.

In an implementation, all of the first angle θ1, the second angle θ2, and the third angle θ3 may satisfy the equation above. In an implementation, the first angle θ1, the second angle θ2, and the third angle θ3 may be 65° or more.

In an implementation, the first height H1 and the first width W1 may be 2.5 µm or more. In an implementation, the second height H2 may be 80% or less of the first height H1. In an implementation, the third height H3 may be 70% or less of the first height H1.

In an implementation, the pixel P and the first inclination structure 510*a* may be arranged such that a horizontal separation distance d0 is between an edge of the pixel P and the first inclination structure 510*a* or between an edge of the opening OP of the pixel-defining layer 119 and the first inclination structure 510*a*. In this case, the horizontal separation distance d0 may be selected taking into account a light path that depends on a refractive index of each medium.

In an implementation, the horizontal separation distance d0 may be about 0.5 µm to about 1.5 µm. In an implementation, the first separation distance d1 between the first inclination structure 510*a* and the second inclination structure 510*b*, and the second separation distance d2 between the second inclination structure 510*b* and the third inclination structure 510*c* may be about 0.5 µm to about 1 µm.

Figure 6:
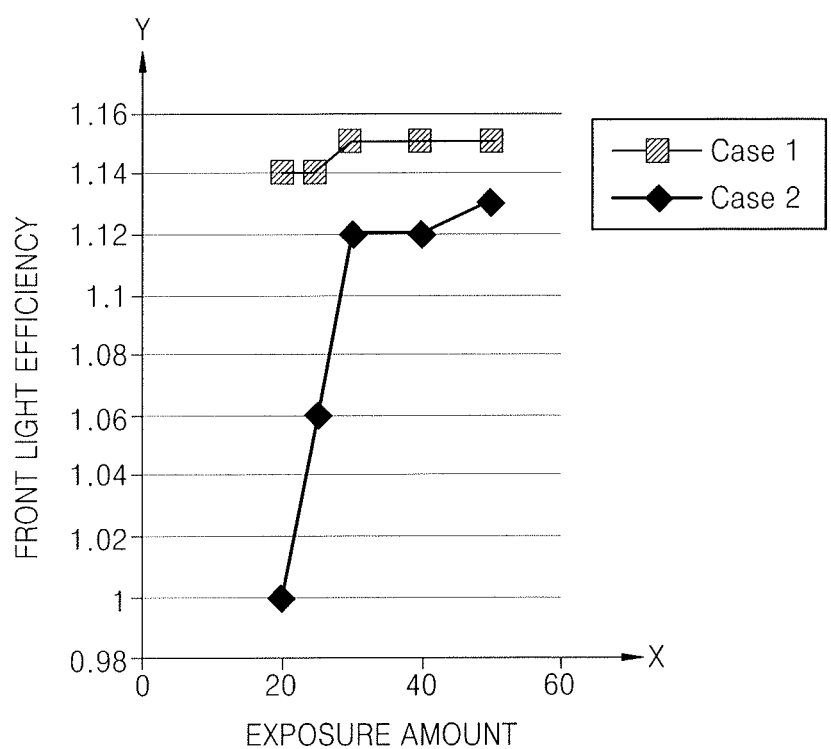
FIG. 6 illustrates a graph showing a front light efficiency increase ratio for Case 1 of increasing a height of a first inclination structure and for Case 2 of employing a plurality of inclination structures having the same size.

FIG. 6 illustrates a graph showing a front light efficiency for Case 1 (where a height of the first inclination structure adjacent to a pixel is highest among the plurality of inclination structures), and for Case 2 (where the heights of the plurality of inclination structures are the same). In FIG. 6, the x-axis represents an exposure amount for forming the plurality of inclination structures. Also, in Case 1, the height H1 of the first inclination structure has been set greater than the height H1' of the first inclination structure of the case 2 (H1>H1'=H2=H3).

Referring to FIG. 6, it may be seen that a front light efficiency of Case 1 is greater than a front light efficiency of Case 2. For example, in the case where the height H1 of the first inclination structure that is adjacent to a pixel is greater than those of the other inclination structures, a front light efficiency is improved.

Also, in the case where the height H1 of the first inclination structure is increased, a front light efficiency may be constant depending on an exposure amount. This means that a process stability may be raised when the height H1 of the first inclination structure is increased.

For example, Case 1 may be a way of raising a front light efficiency while increasing a process stability.

Figure 7:
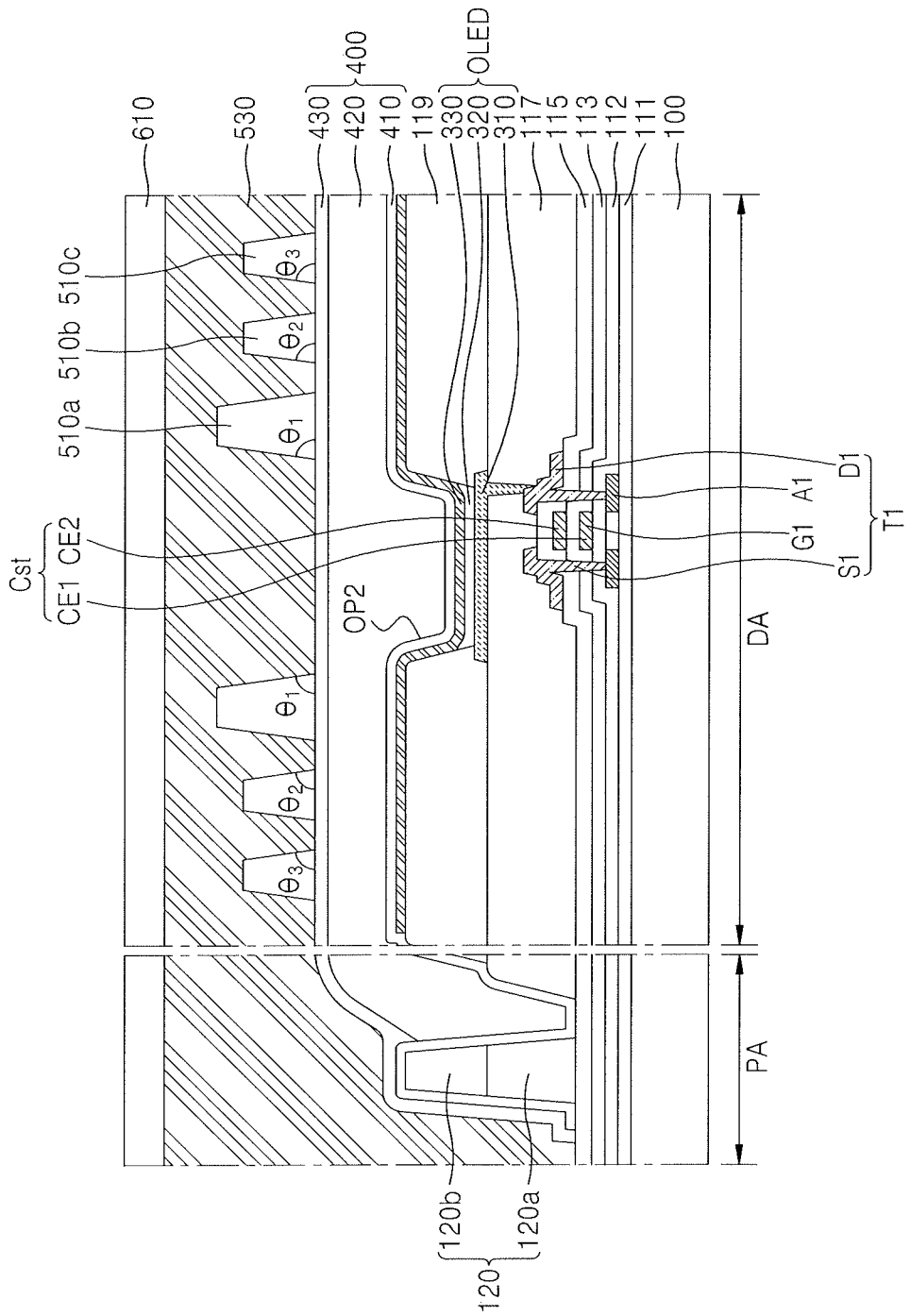
FIG. 7 illustrates a cross-sectional view of a portion of an organic light-emitting display device according to another embodiment.

FIG. 7 illustrates a cross-sectional view of a portion of an organic light-emitting display device according to another embodiment. In FIG. 7, since the same reference numerals as those of FIG. 3 denote the same elements, repeated descriptions thereof are omitted.

Referring to FIG. 7, the organic light-emitting display device according to the present embodiment may include the pixel P implemented as the organic light-emitting diode OLED, the thin-film encapsulation layer 400 covering the organic light-emitting diode OLED, the plurality of inclination structures 510*a*, 510*b*, and 510*c* on the thin-film encapsulation layer 400, and the planarization layer 530 covering the plurality of inclination structures 510*a*, 510*b*, and 510*c* and having a refractive index greater than those of the inclination structures 510*a*, 510*b*, and 510*c*.

The plurality of inclination structures 510*a*, 510*b*, and 510*c* may surround the emission area of one pixel P. The plurality of inclination structures 510*a*, 510*b*, and 510*c* may include the first inclination structures 510*a*, the second inclination structures 510*b*, and the third inclination structures 510*c*.

In an implementation, the height H1 of the first inclination structure 510*a* that is most adjacent to the pixel P among the plurality of inclination structures 510*a*, 510*b*, and 510*c* surrounding one pixel may be greater than the heights of the other inclination structures 510*b* and 510*c*.

In an implementation, the organic light-emitting display device may further include a dam 120 in the peripheral area PA. The dam 120 may be spaced apart from the via layer 117 and the pixel-defining layer 119 and may help prevent an organic material from flowing to an edge of the substrate 100 while the organic encapsulation layer 420 of the thin-film encapsulation layer 400 is formed. In the case where the dam 120 is provided as a plurality of dams, the plurality of dams may be spaced apart from each other.

The dam 120 may include a single layer or a multi-layered structure. As shown, the dam 120 may have a structure in which a first layer 120*a* and a second layer 120*b* are stacked. In this case, the first layer 120*a* may be simultaneously provided with the via layer 117 and may include the same material as that of the via layer 117, and the second layer 120*b* may be simultaneously provided with the pixel-defining layer 119 and may include the same material as that of the pixel-defining layer 119.

Outside the dam 120, the first inorganic encapsulation layer 410 and the second inorganic encapsulation layer 430 of the thin-film encapsulation layer 400 may directly contact each other, and the organic encapsulation layer 420 may not be exposed to the outside. For example, penetration of external air or moisture due to an organic material may be prevented.

In the present embodiment, a window 610 may be on the planarization layer 530. The window 610 may be on an outermost portion of the organic light-emitting display device so as to protect the organic light-emitting display device and may include transparent glass or plastic as an organic transparent base material. The window 610 may be on the display area DA and the peripheral area PA.

In an implementation, a polarization layer, a color filter layer, a touchscreen layer, etc. may be further arranged between the planarization layer 530 and the window 610.

Figure 8:
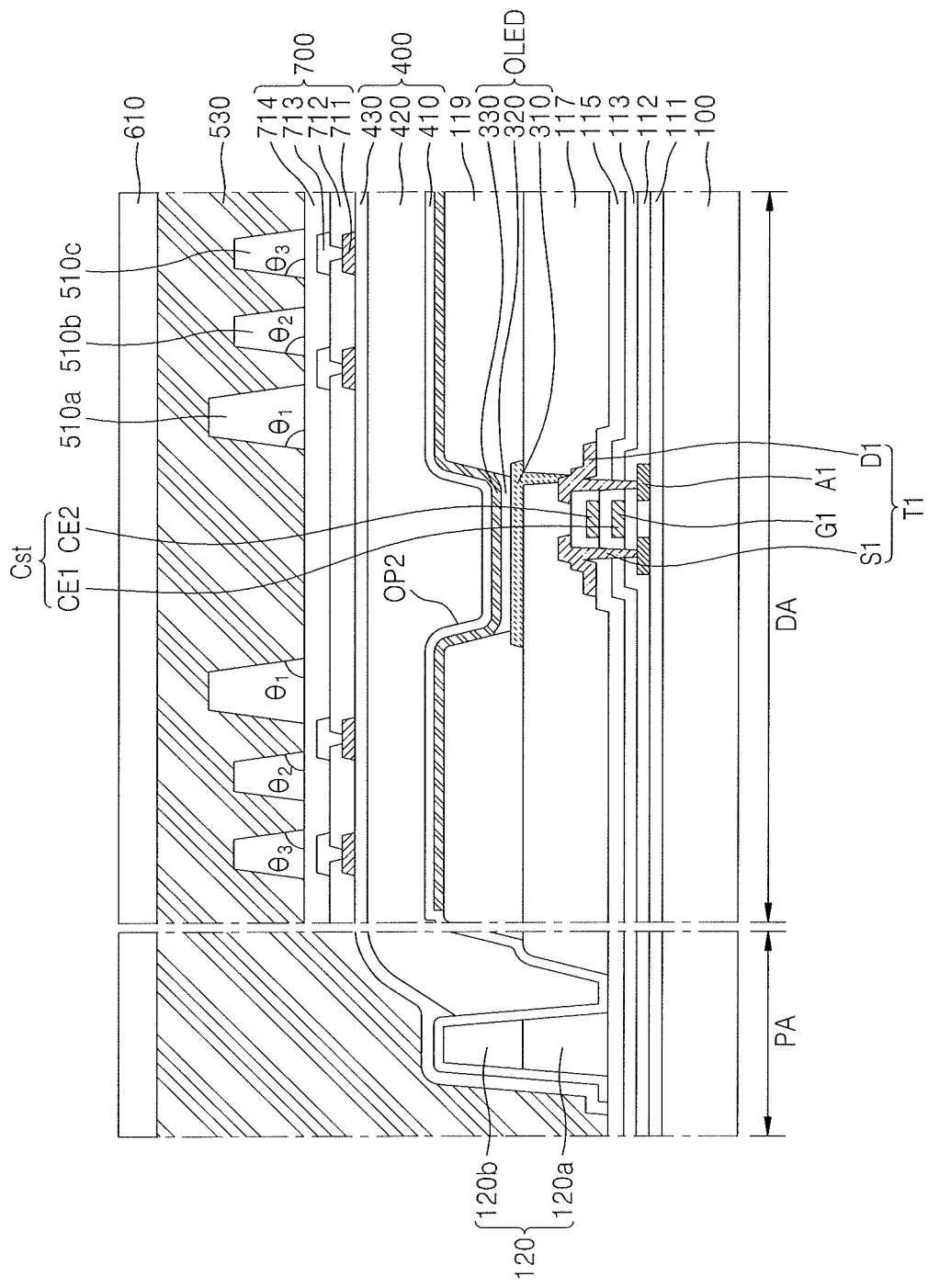
FIG. 8 illustrates a cross-sectional view of a portion of an organic light-emitting display device according to another embodiment.

FIG. 8 illustrates a cross-sectional view of a portion of an organic light-emitting display device according to another embodiment. In FIG. 8, since the same reference numerals as those of FIG. 7 denote the same elements, repeated descriptions thereof are omitted.

The organic light-emitting display device according to the present embodiment may include the pixel P implemented as the organic light-emitting diode OLED, the thin-film encapsulation layer 400 covering the organic light-emitting diode OLED, the plurality of inclination structures 510*a*, 510*b*, and 510*c* on the thin-film encapsulation layer 400, and the planarization layer 530 covering the plurality of inclination structures 510*a*, 510*b*, and 510*c* and having a refractive index greater than those of the inclination structures 510*a*, 510*b*, and 510*c*.

The plurality of inclination structures 510*a*, 510*b*, and 510*c* may surround the emission area of one pixel P. The plurality of inclination structures 510*a*, 510*b*, and 510*c* may include the first inclination structures 510a, the second inclination structures 510b, and the third inclination structures 510c.

In an implementation, the height H1 of the first inclination structure 510a that is most adjacent to the pixel P among the plurality of inclination structures 510a, 510b, and 510c surrounding one pixel may be greater than the heights of the other inclination structures 510b and 510c.

In an implementation, the organic light-emitting display device may further include a touchscreen layer 700 between the thin-film encapsulation layer 400 and the inclination structures 510a, 510b, and 510c. For example, the inclination structures 510a, 510b, and 510c may be on the touchscreen layer 700. The inclination structures 510a, 510b, and 510c may be provided in a ring shape surrounding one pixel P in top view as in FIG. 2A.

In an implementation, the first inclination structure 510a, the second inclination structure 510b, and the third inclination structure 510c may have an open shape instead of a closed shape and may have a shape in which a portion thereof is disconnected.

The touchscreen layer 700 may be provided, e.g., in a capacitance type. When the window 610 is touched, there occurs a change in a mutual capacitance formed between first and second touch electrodes 711 and 713 of the touchscreen layer 700, and the touchscreen layer 700 may determine whether a relevant portion has been touched by detecting the changed mutual capacitance. In an implementation, when there occurs a change in a mutual capacitance formed between first and second touch electrodes 711 and 713 (also referred to as first and second touch conductive layers) and the opposite electrode 330, the touchscreen layer 700 may determine whether a relevant portion has been touched by detecting the changed mutual capacitance. The touchscreen layer 700 may determine whether a relevant portion has been touched by using various methods.

The touchscreen layer 700 according to an embodiment may have a structure in which the first touch conductive layer 711, a first insulating layer 712, the second touch conductive layer 713, and a second insulating layer 714 are sequentially stacked. The touch electrodes 711 and 713 may respectively include the first touch conductive layer 711 and the second touch conductive layer 713.

In an implementation, the second touch conductive layer 713 may serve as a sensor configured to detect whether a touch is made, and the first touch conductive layer 711 may serve as a connection connecting, in one direction, the second touch conductive layer 713 that is patterned.

In an implementation, both the first touch conductive layer 711 and the second touch conductive layer 713 may serve as the sensor. For example, the first insulating layer 712 may include a via hole that exposes a top surface of the first touch conductive layer 711, and the first touch conductive layer 711 and the second touch conductive layer 713 may be connected to each other through the via hole. Since the first touch conductive layer 711 and the second touch conductive layer 713 are used as described above, a resistance of the touch electrodes 711 and 713 may be reduced and thus a response speed of the touchscreen layer 700 may be improved.

In an implementation, the touch electrodes 711 and 713 may be formed in a mesh structure such that light emitted from the organic light-emitting diode OLED passes through. Accordingly, the first touch conductive layer 711 and the second touch conductive layer 713 of the touch electrodes 711 and 713 may not overlap the emission area of the organic light-emitting diode OLED.

Each of the first touch conductive layer 711 and the second touch conductive layer 713 may include a single layer or a multi-layer including a conductive material having excellent conductivity. For example, each of the first touch conductive layer 711 and the second touch conductive layer 713 may include a single layer or a multi-layer including a transparent conductive layer and a conductive material including Al, Cu, and/or Ti. The transparent conductive layer may include a transparent conductive oxide such as indium tin oxide (ITO), zinc oxide (IZO), zinc oxide (ZnO), and indium tin zinc oxide (ITZO). Besides, the transparent conductive layer may include a conductive polymer such as poly-(3,4)-ethylene-dihydroxy thiophene (PEDOT), a metal nano wire, and a graphene. In an embodiment, each of the first touch conductive layer 711 and the second touch conductive layer 713 may include a stacked structure of Ti/Al/Ti.

Each of the first insulating layer 712 and the second insulating layer 714 may include an inorganic material or an organic material. The inorganic material may include at least one of silicon nitride, aluminum nitride, zirconium nitride, titanium nitride, hafnium nitride, tantalum nitride, silicon oxide, aluminum oxide, titanium oxide, tin oxide, cesium oxide, or silicon oxynitride. The organic material may include at least one of an acrylic-based resin, a methacrylic-based resin, a polyisoprene resin, a vinyl-based resin, an epoxy-based resin, a urethane-based resin, a cellulose-based resin, and a phenylene-based resin.

In an implementation, a touch buffer layer may be further arranged between the thin-film encapsulation layer 400 and the touchscreen layer 700. The touch buffer layer may help prevent damage of the thin-film encapsulation layer 400 and blocks an interference signal that may occur when the touchscreen layer 700 is driven. The touch buffer layer may include an inorganic material such as silicon oxide, silicon nitride, silicon oxynitride, aluminum oxide, aluminum nitride, titanium oxide, or titanium nitride, or an organic material such as polyimide, polyester, and acrylic, and may include a stacked body including the above materials.

The touch buffer layer and/or the touchscreen layer 700 may be directly formed on the thin-film encapsulation layer 400 by deposition, etc., and a separate adhesive layer may not be required on the thin-film encapsulation layer 400. Therefore, a thickness of the display device may be reduced.

As described above, according to the embodiments, the plurality of inclination structures surrounding a pixel may be provided and a height of the first inclination structure that is most adjacent to the pixel among the plurality of inclination structures may be the greatest, and a front light efficiency and a lateral visibility may be simultaneously improved.

One or more embodiments may provide an organic light-emitting display device having an improved light efficiency.

One or more embodiments may provide an organic light-emitting display device having an improved light efficiency and simultaneously having excellent lateral visibility.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. An organic light-emitting display device, comprising: a substrate;
   a pixel in a display area of the organic light-emitting display device, the pixel being implemented by an organic light-emitting diode on the substrate;
   a first inclination structure surrounding the pixel in a plan view;
   a second inclination structure at least partially surrounding the first inclination structure in a plan view, and being spaced apart from the first inclination structure in a direction away from the pixel; and
   a planarization layer covering the first inclination structure and the second inclination structure and having a refractive index that is greater than a refractive index of the first inclination structure and is greater than a refractive index of the second inclination structure,
   wherein a height of the first inclination structure is greater than a height of the second inclination structure, and
   wherein the first and second inclination structures are in the display area between the organic light-emitting diode and an adjacent organic light-emitting diode in a plan view.

2. The organic light-emitting display device as claimed in claim 1, wherein a width of a wall of the first inclination structure is greater than a width of a wall of the second inclination structure.

3. The organic light-emitting display device as claimed in claim 1, wherein the height of the first inclination structure is 1.2 times or greater of the height of the second inclination structure.

4. The organic light-emitting display device as claimed in claim 1, wherein the height of the first inclination structure is 2.5 μm or greater.

5. The organic light-emitting display device as claimed in claim 1, wherein a horizontal separation distance along a top surface of the substrate between an edge of the pixel and an inner edge of the first inclination structure is about 0.5 μm to about 1.5 μm.

6. The organic light-emitting display device as claimed in claim 1, further comprising a third inclination structure at least partially surrounding the second inclination structure,
   wherein the height of the second inclination structure is substantially the same as a height of the third inclination structure.

7. The organic light-emitting display device as claimed in claim 1, further comprising a third inclination structure at least partially surrounding the second inclination structure,
   wherein the height of the second inclination structure is greater than a height of the third inclination structure.

8. The organic light-emitting display device as claimed in claim 1, wherein the first inclination structure has a closed loop shape, and
   wherein the second inclination structure has a closed loop shape.

9. The organic light-emitting display device as claimed in claim 1, wherein a cross-sectional shape of the first inclination structure has a tapered inclination, and
   wherein an angle θ of the tapered inclination satisfies the following equation:

$$\theta > \sin^{-1}\left(\frac{n_1}{n_2}\right),$$

in which $n_1$ is a refractive index of the first inclination structure and $n_2$ is a refractive index of the planarization layer.

10. The organic light-emitting display device as claimed in claim 1, further comprising a thin-film encapsulation layer covering the organic light-emitting diode on the substrate, the thin-film encapsulation layer including a first inorganic encapsulation layer, an organic encapsulation layer, and a second inorganic encapsulation layer,
    wherein the first inclination structure and the second inclination structure are on the thin-film encapsulation layer.

11. The organic light-emitting display device as claimed in claim 10, further comprising a dam in a peripheral area of the organic light-emitting display device that is around the display area,
    wherein the first inorganic encapsulation layer and the second inorganic encapsulation layer directly contact each other outside the dam.

12. An organic light-emitting display device, comprising:
    a substrate;
    a pixel in a display area of the organic light-emitting display device, the pixel being implemented by an organic light-emitting diode on the substrate;
    a first inclination structure surrounding the pixel;
    a second inclination structure at least partially surrounding the first inclination structure;
    a planarization layer covering the first inclination structure and the second inclination structure and having a refractive index that is greater than a refractive index of the first inclination structure and is greater than a refractive index of the second inclination structure;
    a thin-film encapsulation layer covering the organic light-emitting diodes on the substrate, the thin-film encapsulation layer including a first inorganic encapsulation layer, an organic encapsulation layer, and a second inorganic encapsulation layer; and
    a touchscreen layer on the thin-film encapsulation layer,
    wherein a height of the first inclination structure is greater than a height of the second inclination structure, and
    wherein the first inclination structure and the second inclination structure are on the touchscreen layer.

13. An organic light-emitting display device, comprising:
    a substrate;
    an organic light-emitting diode in a display area of the organic light-emitting display device, the organic light-emitting diode including a pixel electrode, an intermediate layer, and an opposite electrode;
    a pixel-defining layer covering edges of the pixel electrode and defining an emission area through an opening that exposes a central portion of the pixel electrode;
    a thin-film encapsulation layer covering the organic light-emitting diode and including at least one organic encapsulation layer and at least one inorganic encapsulation layer;
    a plurality of inclination structures on the thin-film encapsulation layer and at least partially surrounding the opening, such that the inclination structures are in the display area between the organic light-emitting diode and an adjacent organic light-emitting diode in a plan view; and
    a planarization layer covering the plurality of inclination structures,
    wherein a height of a first inclination structure that is closest to the emission area among the plurality of inclination structures is greater than heights of other inclination structures of the plurality of inclination structures.

14. The organic light-emitting display device as claimed in claim 13, wherein the plurality of inclination structures include a second inclination structure surrounding the first inclination structure, and wherein the height of the first inclination structure is 1.2 times or greater of a height of the second inclination structure.

15. The organic light-emitting display device as claimed in claim 13, wherein a refractive index of each of the plurality of inclination structures is about 1.4 to about 1.55, and wherein a refractive index of the planarization layer is about 1.6 to about 1.85.

16. The organic light-emitting display device as claimed in claim 13, wherein a horizontal separation distance along a top surface of the substrate between an edge of the opening and an inner edge of the first inclination structure is about 0.5 μm to about 1.5 μm.

17. The organic light-emitting display device as claimed in claim 13, wherein each of the plurality of inclination structures has a closed loop shape.

18. The organic light-emitting display device as claimed in claim 13, wherein a cross-sectional shape of the first inclination structure has a tapered inclination, and wherein an angle θ of the tapered inclination satisfies the following equation:

$$\theta > \sin^{-1}\left(\frac{n_1}{n_2}\right),$$

in which $n_1$ is a refractive index of the first inclination structure and $n_2$ is a refractive index of the planarization layer.

19. The organic light-emitting display device as claimed in claim 13, further comprising a dam in a peripheral area around the display area, wherein the at least one inorganic encapsulation layer includes a first inorganic encapsulation layer and a second inorganic encapsulation layer, and the first inorganic encapsulation layer and the second inorganic encapsulation layer directly contact each other outside the dam.

20. The organic light-emitting display device as claimed in claim 13, further comprising a touchscreen layer on the thin-film encapsulation layer, wherein the plurality of inclination structures are on the touchscreen layer.

21. The organic light-emitting display device as claimed in claim 13, wherein the plurality of inclination structures include a second inclination structure at least partially surrounding the first inclination structure, the first inclination structure has a closed loop shape, and wherein the second inclination structure has a discontinuous shape including a plurality of second sub-islands spaced apart from each other.

* * * * *